(12) United States Patent
Angelopoulos et al.

(10) Patent No.: US 6,436,605 B1
(45) Date of Patent: Aug. 20, 2002

(54) PLASMA RESISTANT COMPOSITION AND USE THEREOF

(75) Inventors: Marie Angelopoulos, Cortlandt Manor; Ari Aviram, Croton-on-Hudson; Edward D. Babich, Chappequa, all of NY (US); Timothy Allan Brunner, Ridgefield, CT (US); Thomas Benjamin Faure, Georgia, VT (US); C. Richard Guarnieri, Somers, NY (US); Ranee W. Kwong, Wappingers Falls, NY (US); Karen E. Petrillo, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/350,939

(22) Filed: Jul. 12, 1999

(51) Int. Cl.$^7$ ............................................. G03F 7/004
(52) U.S. Cl. ...................... 430/270.1; 430/296; 430/323
(58) Field of Search .............................. 430/270.1, 323, 430/947, 296

(56) References Cited

U.S. PATENT DOCUMENTS

| | | | |
|---|---|---|---|
| 3,236,413 A | 2/1966 | Schuster | 220/113 |
| 3,317,319 A | 5/1967 | Mayaud | 96/36.1 |
| 3,412,149 A | 11/1968 | Schlor et al. | 260/556 |
| 3,535,137 A | 10/1970 | Haller et al. | 117/8 |
| 3,790,380 A | 2/1974 | McKee et al. | 96/48 PD |
| 3,839,028 A | 10/1974 | Tamai et al. | 96/1 R |
| 3,885,076 A | 5/1975 | Heidenreich et al. | 428/195 |
| 3,931,435 A | 1/1976 | Gipstein et al. | 427/43 |
| 3,935,332 A | 1/1976 | Poliniak et al. | 427/43 |
| 3,977,874 A | 8/1976 | Roteman | 96/35.1 |
| 3,988,152 A | 10/1976 | Roteman | 96/35.1 |
| 4,011,351 A | 3/1977 | Gipstein et al. | 427/43 |
| 4,027,052 A | 5/1977 | Thompson | 427/43 |
| 4,078,098 A | 3/1978 | Cortellino | 427/43 |
| 4,096,290 A | 6/1978 | Fredericks | 427/43 |
| 4,156,745 A | 5/1979 | Hatzakis et al. | 427/43 |
| 4,259,407 A | 3/1981 | Tada et al. | 428/421 |
| 4,275,092 A | 6/1981 | Nakayama et al. | 427/54.1 |
| 4,289,845 A | 9/1981 | Bowden et al. | 430/296 |
| 4,312,935 A | 1/1982 | Engler et al. | 430/296 |
| 4,414,313 A | 11/1983 | Lai | 430/295 |
| 4,454,222 A | 6/1984 | Tada et al. | 430/326 |
| 4,465,767 A | 8/1984 | Oba et al. | 430/271 |
| 4,513,077 A | 4/1985 | Isobe et al. | 430/270 |
| 4,520,088 A * | 5/1985 | Senga et al. | 430/49 |
| 4,764,247 A | 8/1988 | Leveriza et al. | 156/643 |

(List continued on next page.)

FOREIGN PATENT DOCUMENTS

| | | |
|---|---|---|
| EP | 0 059 109 A1 | 9/1982 |
| JP | 62070838 A | 4/1987 |

OTHER PUBLICATIONS

Moreau, Semiconductor Lithography: Principles, Practices and Materials, Plenum Press, NY, 1988, pp. 710, 731.

Feder et al, Doped Resist for Electrons and X Rays with Enhanced Sensitivity, IBM TDB, Dec. 1975, pp. 2343–2345.

Chiu, Oxidation Hardening Technique for Developed Resist Films, IBM TDB, Dec. 1977, p. 2706.

Babich et al, Resist Patterning by Dry Development, Research Disclosure, No. 304, Aug. 1989.

chiu et al, Post Exposure Treatment of Resist to Improve Resolution, IBM TDB, Nov. 1978, p. 2348.

*Primary Examiner*—John S. Chu
(74) *Attorney, Agent, or Firm*—Connolly Bove Lodge & Hutz; Daniel P. Morris

(57) ABSTRACT

The reactive ion etching resistance of radiation sensitive resist composition is enhanced by adding at least one organometallic compound to a radiation sensitive polymer. The resist composition can be patterned and used as mask for patterning an underlying layer.

25 Claims, 6 Drawing Sheets

ZEP + Yittrium 150 nm features

U.S. PATENT DOCUMENTS

| | | |
|---|---|---|
| 4,837,125 A | 6/1989 | Knapek et al. ............. 430/270 |
| 4,935,094 A | 6/1990 | Mixon et al. ............... 156/643 |
| 5,409,801 A | 4/1995 | Kasowski et al. .......... 430/296 |
| 5,605,781 A * | 2/1997 | Gelorme et al. ......... 430/280.1 |
| 5,733,706 A | 3/1998 | Sezi et al. ............... 430/270.1 |
| 5,801,212 A * | 9/1998 | Okamoto et al. ............. 522/16 |
| 5,919,596 A * | 7/1999 | Hedrick et al. .......... 430/270.1 |
| 6,103,452 A * | 8/2000 | Kakinuma et al. ....... 430/281.1 |
| 6,171,757 B1 * | 1/2001 | Angelopoulos et al. .. 430/270.1 |
| 6,183,935 B1 * | 2/2001 | Hanabata et al. ........ 430/270.1 |

* cited by examiner

ZEP 7000A + Additive

ZEP + Yittrium 150 nm features

PLASMA RESISTANT COMPOSITION AND USE THEREOF

TECHNICAL FIELD

The present invention relates to radiation sensitive resist compositions which exhibit enhanced resistance to plasma and especially to $Cl_2/O_2$ plasma used in reactive ion etching. The present invention is concerned with the compositions as well as their use in lithography. For instance, the materials of the present invention are suitable for use in device and mask fabrication on optical, e-beam, x-ray and ion-beam lithography tools.

BACKGROUND OF INVENTION

In the manufacture of patterned devices and especially microelectronic devices, the processes of etching different layers which constitute the finished product are among the most crucial steps involved. One method widely employed in the etching process is to overlay the surface to be etched with a suitable mask.

The mask is typically created by imagewise forming a pattern of resist material over those areas of the substrate to be shielded from the etching. The resist is normally formed of a polymeric organic material. The pattern is formed by imagewise exposing the resist material to irradiation by lithographic techniques. The irradiation employed is usually x-ray, UV radiation, or electron beam radiation.

Radiation sensitive materials and/or compositions are either positive-acting (i.e. radiation solubilizable) or negative-acting (i.e. radiation insolubilizable or crosslinkable). Positive-working sensitive compositions are rendered soluble (or developable) by exposure to radiation (UV light, x-ray or electron-beam) and can be removed using selective developing solutions leaving unexposed areas intact. Negative-working sensitive compositions are those which become insoluble upon exposure to actinic radiation. Selected solutions can dissolve and remove the unexposed areas of the composition while leaving the exposed portions intact. Development of such exposed materials yields negative tone images.

The production of binary masks includes pattern definition by exposure of electron beam resists on, for instance, a chrome coated glass plate. The image is then developed and the pattern is etched into chrome by either aqueous based wet etching or by reactive ion etching with a chlorine based plasma (see U.S. Pat. No. 3,236,413).

With the advent of shrinking dimensions, the photomask of nX enlargement (n-4-10X) is also shrinking to less than 400 nm in dimensions. Because wet etching causes undercutting or undesired enlargement, reactive ion etching (RIE) has been utilized (see Tsai et al U.S. Pat. No. 3,412,149). In RIE>50% of the resist film can be eroded away. The particular resists that have been used for electron beam exposure are polymers that undergo main chain degradation. The primary examples are derived from a positive resist such as polymethylmethacrylate (PMMA) described in U.S. Pat. No. 3,535,137 and polybutene sulfone described in U.S. Pat. No. 3,935,332. Improved contrast developers for PMMA can be found such as amyl acetate as described, for example, in U.S. Pat. No. 3,931,435 and a mixture of methyl isobutyl ketone and water as described in U.S. Pat. No. 4,078,098. All of these resists and copolymers are described in W. Moreau, *Semiconductor Lithography*, Plenum Press, 1989, Chapter 3. These resists, however, are not RIE etch resistant and thus the pattern cannot be transferred by an RIE process.

For reactive ion etching, a commercial resist identified as ZEP manufactured by Nippon Zeon (see U.S. Pat. No. 3,236,397) has been used. ZEP is composed of a copolymer of alpha-chloromethacrylate and alpha-methyl styrene (PCMMS). Copolymers of polyalpha-chloromethacrylate are described in U.S. Pat. Nos. 4,359,481, 4,011,351 and 4,454,222. A preferred example is described in U.S. Pat. No. 4,259,407 which is directed to a copolymer of poly(alpha-chloroacrylate-alpha-methylstyrene), commercially available from Nippon Zeon as ZEP 7000 electron beam resist. U.S. Pat. No. 4,259,407 discusses a developer of a ketone such as 3 pentanone mixed with another ketone. In U.S. Pat. No. 4,454,222, a developer comprising MIBK (4 methyl-2-butanone) and isopropanol or a mixture with 2 butanone is suggested for a trifluoromethyl alpha-chloroacrylate-methacrylic acid copolymer in a spray development mode. U.S. Pat. No. 4,414,313 describes a mixture of dimethylacetamide and toluene as a developer for a poly(alpha-chloroacrylate-methacrylic acid) copolymer. The disclosures of U.S. Pat. Nos. 4,359,481, 4,011,351, 4,454,222, 4,259,407 and 4,414,313 are incorporated herein by reference.

The ZEP resist uses a commercial developer preferably consisting of the following compositions: ZED 300-methyl ethyl ketone/anisole 93/7 by weight, ZED 400-diglyme/methyl ethyl ketone 20/80 by weight, and ZED 500-diethyl ketone/diethyl malonate 50/50 by weight.

In addition to using ZEP type resists for chrome mask fabrication, other masks, substrates or direct exposure of silicon wafers could also be exposed and developed with the resist, exposure tools, and developer modes used in semiconductor fabrication.

After the resist is developed forming the desired mask, the substrate and mask can be immersed in a chemical solution which attacks the substrate to be etched while leaving the mask intact. These wet chemical processes suffer from the difficulty of achieving well-defined edges on the etched surfaces. This is due to the chemicals undercutting the mask and the formation of an isotropic image. In other words, conventional chemical wet processes do not provide the resolution considered necessary to achieve optimum dimensions consistent with current processing requirements.

Moreover, such wet etching processes are undesirable because of the environmental and safety concerns associated therewith.

In view of the various drawbacks associated with wet chemical development, various so-called "dry processes" have been suggested to improve the process from an environmental viewpoint, as well as to reduce the relative cost of the etching. Furthermore, these "dry processes" have the potential advantage of greater process control and higher aspect ratio images. Also, when fabricating patterns having feature sizes below 350 nm, dry etching processes are necessary.

Such "dry processes" generally involve passing a gas through a container and creating a plasma in this gas. The species in this gas are then used to etch a substrate placed in the chamber or container. Typical examples of such "dry processes" are plasma etching, sputter etching, and reactive ion etching.

Reactive ion etching provides well-defined, vertically etched sidewalls.

One of the challenges in the fabrication of microelectronic devices and masks is to develop a resist which exhibits good lithographic performance as well as high dry etch resistance for subsequent pattern transfer into an underlying substrate.

The dry etch chemistries include $O_2$ currently used for antireflective coatings, $Cl_2/O_2$ currently used for chrome etching in mask fabrication, $Cl_2$ based plasma for polysilicon etch, and fluorocarbon based plasmas such as $CF_4$ for oxide etching. These plasmas are examples only and are not meant to limit the scope. Conventional novolak/diazonapthoquinone resists used for i-line lithography have to date exhibited the best dry etch resistance. ZEP is an e-beam resist which has been adopted by the industry for advanced mask making to replace the conventional wet etch polybutenesulfone (PBS) process. Although ZEP provides significant improvement over the PBS process, its dry etch resistance to $Cl_2/O_2$ is marginal (etch rate of 1.95 nm/s). Novolac is 1.4 nm/s.

There is a need to develop radiation sensitive compositions that provide improved dry etch resistance for use in mask fabrication (binary, attenuating phase shift masks, alternating phase shift masks) and for device fabrication.

The use of silicon and germanium has been intended to impart $O_2$ etch resistance to certain resist materials. For example, see U.S. Pat. Nos. 4,764,247, 4,935,094 and 5,733,706 and *Microelectronic Engineering* 3, 279 (1985). However, these do not suggest masking against $Cl_2/O_2$ reactive ion etching.

SUMMARY OF INVENTION

The present invention provides resist compositions which are sensitive to imaging irradiation while exhibiting enhanced resistance to reactive ion etching. Photoresist compositions of the present invention typically exhibit enhanced resistance to reactive ion etching using various plasmas including $Cl_2/O_2$ plasma, $O_2$, $Cl_2$ and fluorocarbons such as $CF_4$. As would be understood by those skilled in the art, $Cl_2/O_2$ plasma refers to a plasma containing atomic Cl and O from the decomposition in the plasma of $Cl_2$ and $O_2$ species.

In particular, the resist compositions of the present invention comprise a radiation sensitive polymer and at least one organometallic compound.

The present invention also relates to resist compositions comprising a radiation sensitive polymer and at least one organometallic compound of at least one metal selected from the group consisting of yttrium, aluminum, iron, titanium, zirconium, hafnium and mixtures thereof.

The present invention also relates to a method for forming a pattern of a resist which comprises:
a) providing on a substrate a layer of a resist composition which comprises a radiation sensitive polymer and at least one organometallic compound;
b) imagewise exposing the layer of resist composition to irradiation; and
c) developing the resist to thereby form the pattern.

A further aspect of the present invention relates to forming a pattern on a substrate which comprises:
a) providing a layer to be patterned on a substrate,
b) providing on the layer to be patterned a layer of a resist composition which comprises a radiation sensitive composition and at least one organometallic compound,
c) imagewise exposing the layer of resist composition to irradiation,
d) developing the resist to form the desired pattern, and
e) subjecting the layer to be patterned to reactive ion etching with the resist acting as a mask to thereby form the desired pattern on the substrate.

A still further aspect of the present invention relates to method for forming a pattern of a resist which comprises:
a) providing on a substrate a layer of a resist composition which comprises a radiation sensitive polymer and at least one organometallic compound of at least one metal selected from the group consisting of yttrium, aluminum, iron, titanium, zirconium and hafnium and mixtures thereof;
b) imagewise exposing the layer of resist composition to irradiation; and
c) developing the resist to thereby form the pattern.

Another aspect of the present invention relates to forming a pattern on a substrate which comprises:
a) providing a layer to be patterned on a substrate,
b) providing on the layer to be patterned a layer of a resist composition which comprises a radiation sensitive composition and at least one organometallic compound of at least one metal selected from the group consisting of yttrium, aluminum, iron, titanium, zirconium and hafnium and mixtures thereof,
c) imagewise exposing the layer of resist composition to irradiation,
d) developing the resist to form the desired pattern, and
e) subjecting the layer to be patterned to reactive ion etching with the resist acting as a mask to thereby form the desired pattern on the substrate.

The present invention is also concerned with structures comprising a patterned layer thereon wherein the patterned layer comprises a radiation sensitive resist polymer and at least one organometallic compound.

A further aspect of the present invention relates to a structure comprising a substrate having a patterned layer thereon wherein the patterned layer comprises a radiation sensitive resist polymer and at least one organometallic compound of at least one metal selected from the group consisting of yttrium, aluminum, iron, titanium, zirconium and hafnium and mixtures thereof.

Another aspect of the present invention is concerned with a resist composition exhibiting improved resistance to reactive ion etching which comprises a radiation sensitive polymer and at least one filler selected from the group consisting of fused silica, other silicon dioxides, talcum, mica, metals such as aluminum, titanium, copper and nickel, metal oxides such as titanium dioxide, chrome, copper oxide, aluminum oxide, nickel oxide and other metal compounds such as metal nitrides and metal carbides.

Furthermore, the present invention relates to a method for forming a pattern of a radiation sensitive resist which comprises:
a) providing on a substrate a layer of a radiation sensitive resist composition which comprises a radiation sensitive resist polymer and at least one of the above-disclosed fillers;
b) imagewise exposing the layer of resist composition to irradiation; and
c) developing the resist to thereby form the pattern.

In addition, the present invention is concerned with a method for forming a pattern on a substrate which comprises:
a) providing a layer to be patterned on a substrate,
b) providing on the layer to be patterned a layer of a radiation sensitive resist composition which comprises a radiation sensitive resist composition and at least one of the above-disclosed fillers,
c) imagewise exposing the layer of radiation sensitive resist composition to irradiation, d) developing the resist to form the desired pattern, and e) subjecting the layer to be patterned to reactive ion etching with the resist acting as a mask to thereby form the desired pattern on the substrate.

Another aspect of the present invention is concerned with a structure comprising a substrate having a patterned layer thereon wherein the patterned layer comprises a radiation sensitive resist polymer and at least one of the above-disclosed fillers.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
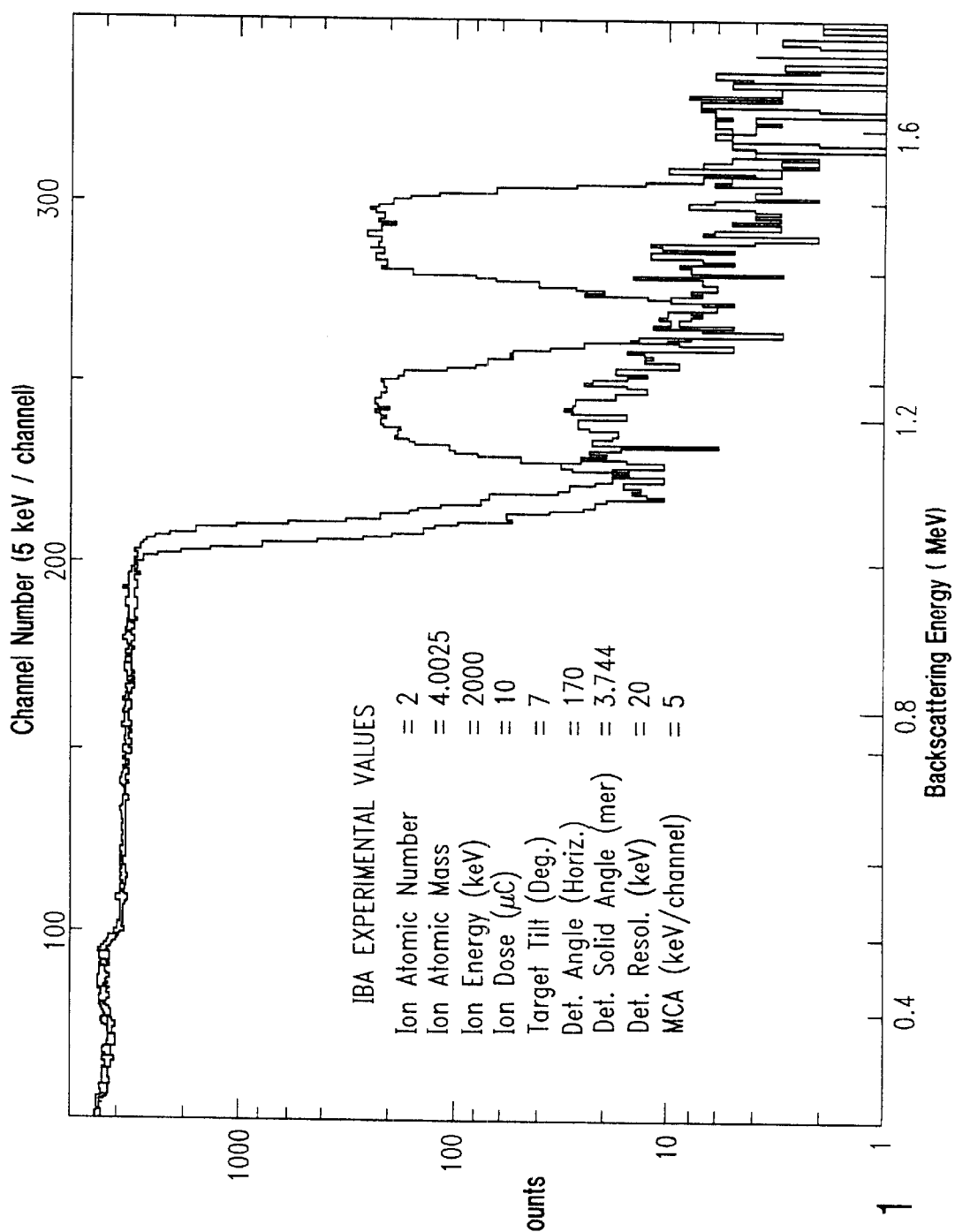
FIG. 1 illustrates Rutherford Backscattering spectrum of two films of ZEP containing 3% by weight of Ferrocene aldehyde. Curve "a" represents a film baked at 100° C. for 3 minutes and curve "b" a film baked at 180° C. for 3 minutes. The peaks at the right indicate that the ferrocene aldehyde is not present after high temperature baking.

It has been found according to the present invention that various organometallic compounds can be added to radiation sensitive compositions to enhance the resistance of the composition to reactive ion etching and especially to reactive ion etching in $Cl_2/O_2$ plasmas. The harsh environment of a $Cl_2/O_2$ plasma etch process severely limits the choice of available resist compositions that can even survive the etching process. Organometallic compounds employed in the present invention increase the resistance of resists to a sufficient extent for use in a manufacturing process.

The organometallic compounds enhance the reactive ion etching resistance without adversely affecting the lithographic properties of the resist.

The organometallic compounds employed according to the present invention are organometallic compounds of yttrium, aluminum, iron, titanium, zirconium and hafnium. Mixtures of organometallic compounds can be employed, if desired, as well as organometallic compounds containing mixtures of metals.

Examples of some specific organometallic compounds for use in the present invention are yttrium tris hexafluoroacetylacetonate, yttrium tris(2,2,6,6-hexamethyl)-3,5-heptanedionate, yttrium tris diphenylacetylacetonate, 1,2-diferrocenylethane, aluminum tris(2,2,6,6-tetramethyl)-3-5-heptanedionate, aluminum lactate, aluminum-8-hydroxyquinoline, bis (cyclopentadienyl)titanium pentasulfide, bis (pentamethylcyclopentadienyl)hafnium dichloride, zirconium acetylacetonate, zirconium tetra(2,26,6-tetramethyl)-3,5-pentanedionate, zirconium tetra(1,5-diphenylpentane-2-4-dione), ferrocene aldehyde, ferrocene methanol, ferrocene ethanol, ferrocene carboxylic acid, ferrocene dicarboxylic acid, 1,2 diferrocene ethane, 1,3 diferrocene propane, 1,4 diferrocene butane and decamethylferrocene.

The preferred compounds are the organometallic compounds of yttrium, zirconium, titanium and hafnium. Iron and aluminum compounds are effective when low temperature bakes are employed but not necessarily at high temperature bakes. For example, see FIG. 1 which illustrates this point.

The amount of organometallic compound employed is typically about 0.1 to about 25% by weight, more typically from about 0.1 to about 10% by weight, preferably about 0.2 to about 5% by weight, and most preferably about 0.3% to about 1% by weight based upon the weight of the radiation sensitive polymer.

The organometallic compounds can be used with a wide variety of resist polymers, both chemically amplified and non-chemically amplified resists. Some examples of resists include acrylate/methacrylate/chloroacrylate based resists (homopolymers and copolymers thereof), ZEP which is a copolymer of alphachloromethylacrylate and methylstyrene, polysulfones, novolak/diazonapthoquinones, polyhydroxystyrene based resists such as the Shipley APEX, UV-X based resists, cycloaliphatic based resists and silicon containing resists. Among the current e-beam resists used in the industry, the commercial resist ZEP, a product of Nippon Zeon Company, Japan, has received industry wide acceptance.

The organometallic compound should be soluble in the resist solvent and not cause precipitation. The selection of a particular organometallic compound for a particular resist can be determined by those skilled in the art without undue experimentation once aware of this disclosure.

The compositions can include fillers in addition to or in place of the organometallic compounds. Suitable fillers include fused silica, other silicon dioxides, talcum, mica, metals such as aluminum, titanium, copper and nickel, metal oxides such as titanium dioxide, chrome, copper oxide, aluminum oxide, nickel oxide and other metal compounds such as metal nitrides and metal carbides. Such are typically present in amounts of about 0.1 to about 15%. In addition, if desired the compositions can include conventional additives.

The following illustrates a typical fabrication sequence for providing optical masks for microlithography by providing a pattern of chromium metal on a quartz plate by the following steps:

1. A thin film of chromium metal is provided on the surface of a quartz plate.
2. The metal layer is coated with an electron-beam resist.
3. The resist is patterned by electron-beam.
4. The plate is developed in a suitable developer.

5. The exposed chromium film is etched either by wet etch or by dry etch.

6. The residual resist is removed.

The following non-limiting examples are presented to further illustrate the present invention:

EXAMPLE 1

To about 10 g of ZEP 7000A resist were added about 50 mg of yttrium hexafluoroacetylacetonate. The solution was stirred at room temperature for about 18 hours and then filtered through a 0.2 micrometer filter. A film was spin coated onto a Si wafer and post apply baked (PAB) for about 3 minutes at about 180° C. followed by about 3 minutes at about 100° C. The films were used in a RIE $Cl_2/O_2$ plasma etch and an e-beam pattern formation. It was found that the etch rate was 1.40 nm/sec. (which is the same rate achieved by the industry standard—Novolak) and the pattern resolution was 0.10 micrometer lines in space. ZEP 7000A is a 15% solids solution in anisole. The etch rate of ZEP 7000A is 1.95 nm/sec.

EXAMPLE 2

To about 10 g of ZEP 7000A resist were added about 46 mg of yttrium tris (2,2,6,6-tetramethylheptane-3-5-dione) as in Example 1. The solution was spin coated on Si wafers. The films were subjected to a RIE etch and e-beam pattern formation. The etch rate was found to be 1.45 nm/sec, and resolution of 0.10 micrometers for isolated lines and lines in space.

EXAMPLE 3

To about 10 g of ZEP 7000A resist were added about 31 mg of yttrium tris (2,2,6,6-tetramethylheptane-3,5-dione) as in Example 1. The RIE etch rate in $Cl_2/O_2$ plasma was 1.67 nm/sec.

EXAMPLE 4

To a solution of about 10 g of ZEP 7000A were added about 27 mg of 1,2-diferrocenylethane. The solution was treated as in Example 1 and tested for RIE etch rate. It was found to be 1.80 nm/sec.

EXAMPLE 5

To a solution of about 10 g of ZEP 7000A were added about 41 mg of aluminum tris(2,2,6,6-tetramethyl)-3-5-heptanedionate followed by a 180° C. PAB. The solution was used as in Example 1 and tested for RIE etch rate. The rate was found to be identical with ZEP films without the additive. Films that had lower PAB of about 100° C. showed lower rates of etching of about 1.70 nm/sec.

EXAMPLE 6

To a solution of about 10 g of ZEP 7000A were added about 100 mg of ferrocenyl aldehyde as in Example 1. A Si wafer was spin coated with this resist and the film was used for etch rate determination. The etch rate of films made of this formulation was 1.95 nm/sec., the same as pure ZEP.

EXAMPLE 7

A film of ZEP containing 2% (iron atom) ferrocenyl aldehyde was prepared as in Example 6 but the PAB was 100° C. This film showed initial RIE rate of 1.02 nm/sec and a constant decrease in etch rate as the etching progressed.

The results of Example 6 were obtained with other organometallic additives. A few ferrocene compounds have been found to sublime from the film during the post apply bake (PAB) step and the metal atoms are not found in the film when the etching takes place. These ferrocene compounds had in common a single ferrocene group. Examples of these compounds are ferrocene, ferrocene methanol, ferrocene carboxylic acid, benzoyl ferrocene, acetyl ferrocene diacetyl ferrocene. The analysis of choice for determining the presence of the additive metal atoms in the film was RBS (Rutherford Backscattering). An example of the analysis results of two ZEP films containing ferrocene methanol is shown in FIG. 1. One of the films was baked at 180° C. while the other at 120° C. Clearly, the higher temperature bake causes loss of iron. The effect of the PAB on the etching results is best exemplified in Example 7 where ferrocenyl aldehyde that did not affect the etch rate in Example 6 (PAB 180° C.) had marked influence on the etch rate (PAB 100° C.). However, when using 1,2-diferrocenylethane and a PAB at 180° C., such was retained in the film and the etch rate was 1.65 nm/sec. The same kind of result-as experienced with ferrocenyl aldehyde was obtained with aluminum in Example 5.

Figure 2:
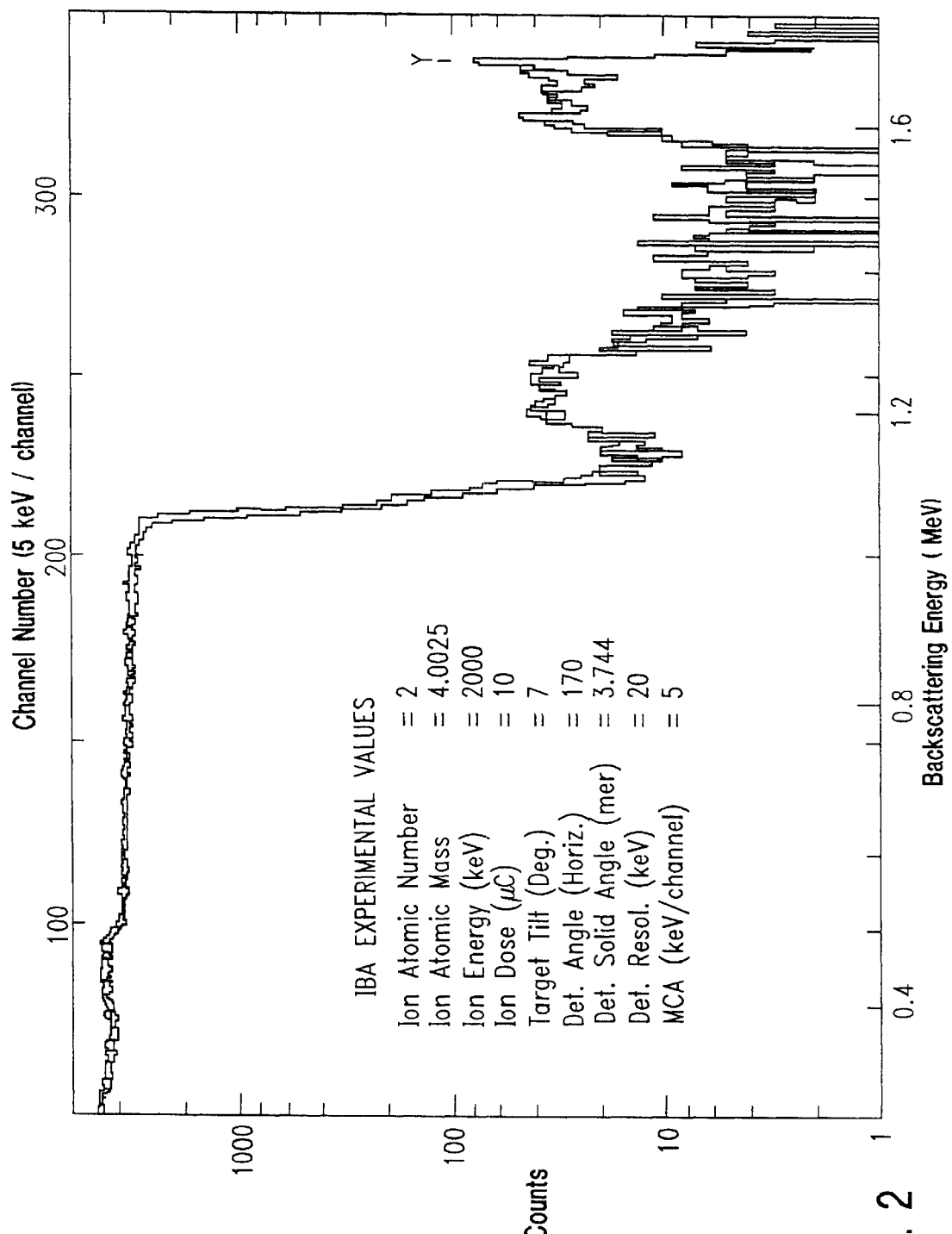
FIG. 2 illustrates Rutherford Backscattering spectrum ZEP films containing 0.3% by weight of yttrium baked at two different temperatures. Note that the yttrium is maintained in the film at both temperatures indicated.
Figure 3:
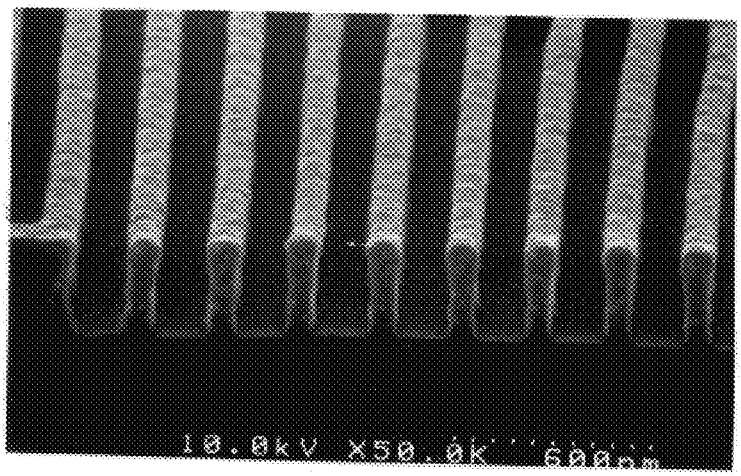
FIG. 3 illustrates lithography results of ZEP films according to example 1 in the specification.
Figure 3:
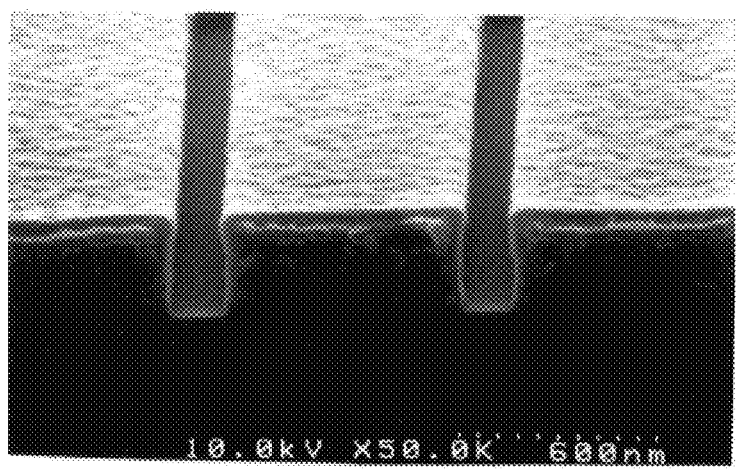
Figure 3:
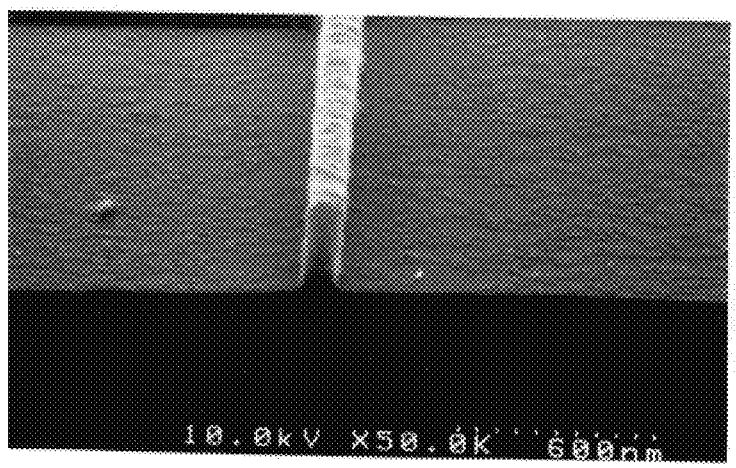
Figure 4:
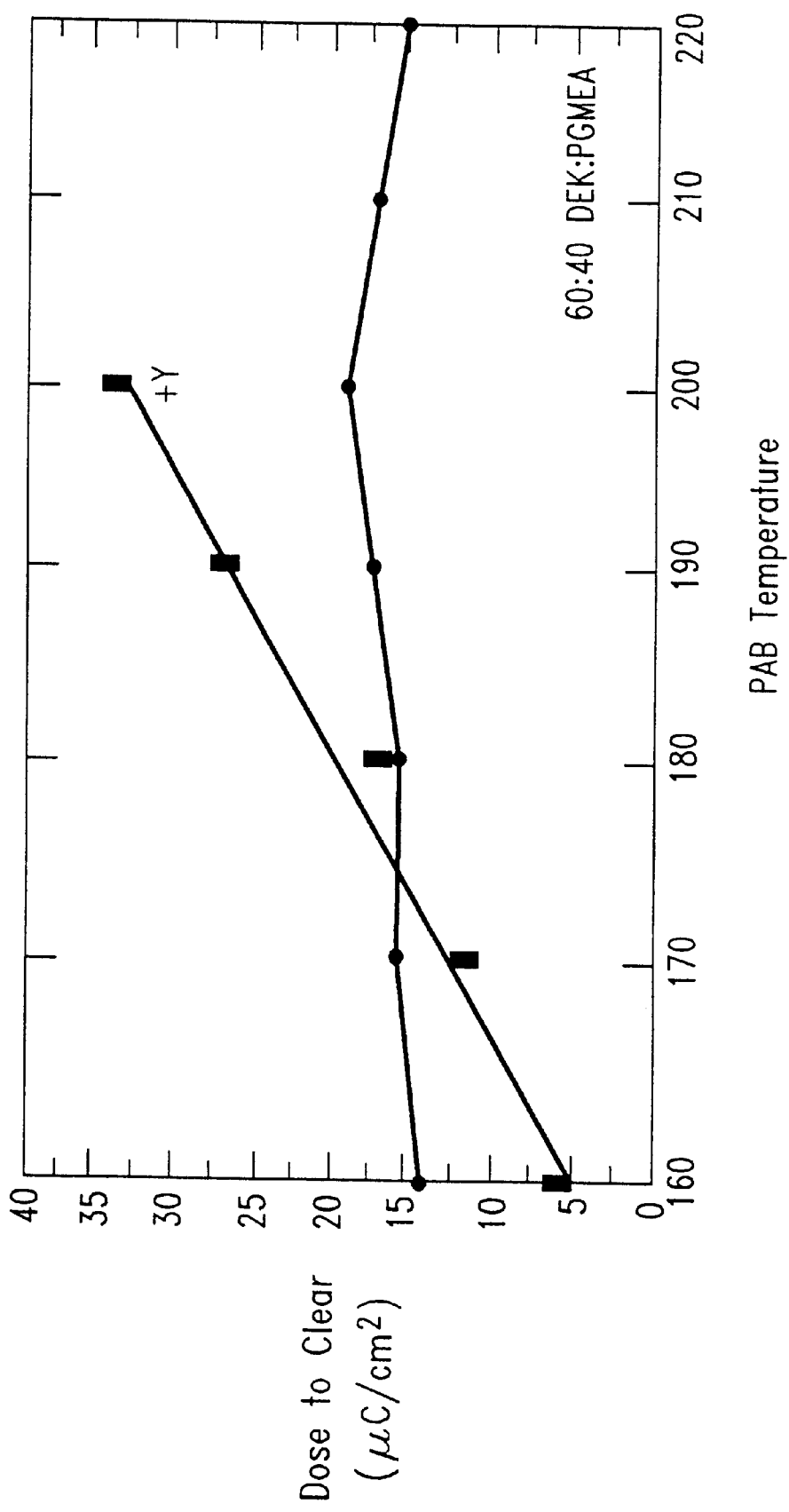
FIG. 4 illustrates the PAB sensitivity of ZEP films with yttrium hexafluoroacetyl acetonate compared to the PAB sensitivity of ZEP alone.
Figure 5:
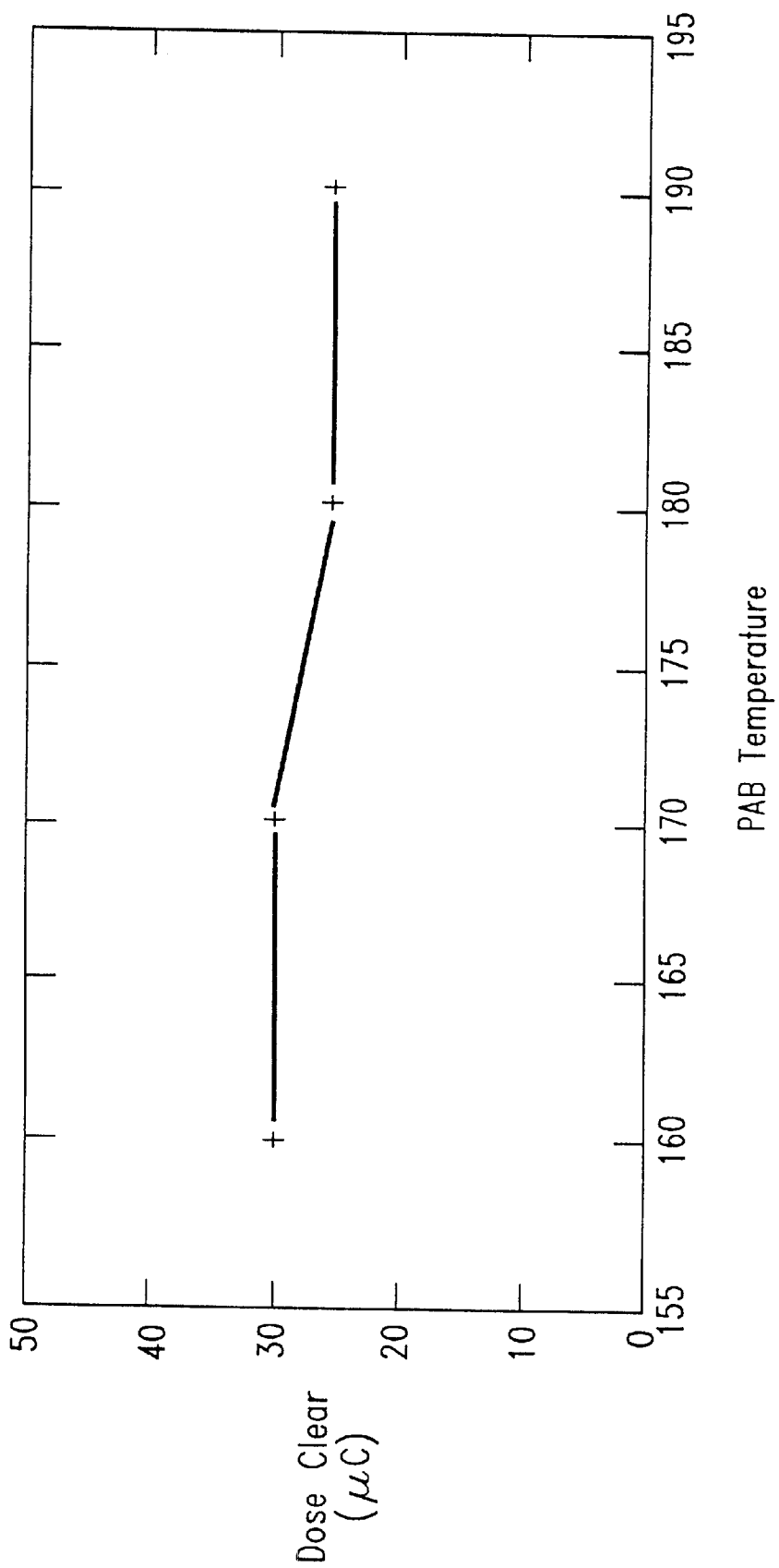
FIG. 5 shows the PAB sensitivity of ZEP films that contained yttrium tris(2,2,6,6-tetramethyl-3,5-heptanedionate) according to example 2.
Figure 6:
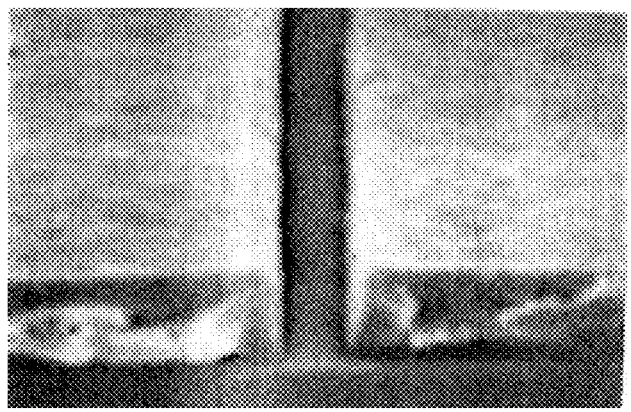
FIG. 6 shows lithography results of ZEP films containing yttrium tris(2,2,6,6-tetramethyl-3-5-heptanedionate) according to example 2.
Figure 6:
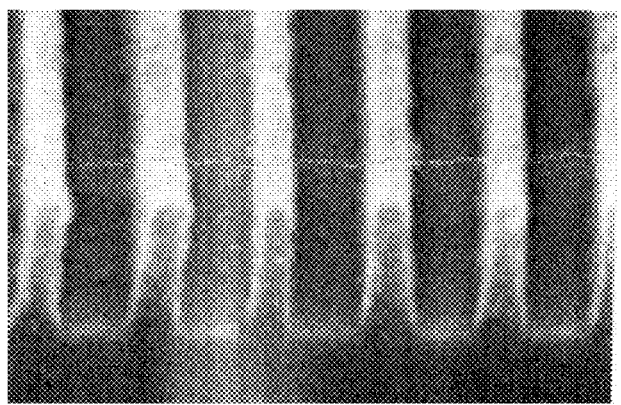

The yttrium compounds described in Examples 1 and 2 did not sublime from the resist during the PAB at 180° C. This is evident from RBS studies with these compounds. The RBS spectra of the yttrium compound of Example 1 is shown in FIG. 2. Electron beam lithography of ZEP 7000A containing yttrium hexafluoroacetylacetonate that is described in Example 1 is shown in FIG. 3. The resolution with this additive is 125 nanometers. It was also observed that this particular additive causes a higher PAB (post apply bake) sensitivity than is found in ZEP. A plot that describes the PAB sensitivity of ZEP and ZEP with the yttrium additive mentioned in Example 1 is shown in FIG. 4. It was also found that the molecular weight of the ZEP polymer changes due to the PAB. When ZEP alone was baked at 180° C. for three minutes, as recommended, the molecular weight of the polymer was found to be 118,098. When the yttrium additive of Example 1 was incorporated into the resist, and the same PAB was used, the molecular weight dropped to 64145. This result was not obtained with the yttrium compound of Example 2. In this case, the molecular weight remained unaltered even after the PAB at 180° C. The yttrium additive used in Example 2, namely yttrium tris(2, 2,6,6-tetramethyl-3,5-heptanedionate) did not adversely influence the PAB sensitivity of ZEP as the yttrium compound used in Example 1. A plot of the PAB sensitivity of films containing this compound that were prepared as described in Example 2 is shown in FIG. 5. The resolution of ZEP containing yttrium additive of Example 2 was found to be 100 nanometers. FIG. 6 shows a profile obtained with this additive.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

Also, it is intended that the appended claims be construed to include alternative embodiments.

What is claimed is:

1. A resist composition exhibiting improved resistance to reactive ion etching which comprises a radiation sensitive polymer and at least one organometallic compound of at least one metal selected from the group consisting of yttrium, zirconium, hafnium and mixtures thereof.

2. The composition of claim 1 wherein the amount of the organometallic compound is about 0.1 to about 25% by weight based upon the weight of the radiation sensitive polymer.

3. The composition of claim 1 wherein the amount of organometallic compound is about 0.1 to about 10% by weight based upon the radiation sensitive polymer.

4. The composition of claim 1 wherein the amount of the organometallic compound is about 0.2 to about 5% by weight of the radiation sensitive polymer.

5. The composition of claim 1 wherein the amount of the organometallic compound is about 0.3% to about 1% by weight based upon the radiation sensitive polymer.

6. The composition of claim 1 wherein the radiation sensitive polymer is an e-beam resist.

7. The composition of claim 1 wherein the radiation sensitive polymer is a chemically amplified resist.

8. The composition of claim 1 wherein the organometallic compound is yttrium hexafluoroacetylacetonate.

9. The composition of claim 1 wherein the organometallic compound is yttrium tris(2,2,6,6-hexamethyl)-3,5-heptanedionate.

10. The composition of claim 1 wherein the organometallic compound is yttrium diphenylacetylacetonate.

11. The composition of claim 1 wherein the organometallic compound is zirconium IV trifluoroacetylacetonate.

12. The composition of claim 1 wherein the organometallic compound is zirconium tetra(1,5-diphenylpentane-2,4-dione).

13. The composition of claim 1 wherein the organometallic compound is zirconium tetra(2,2,6,6-tetramethyl)-3,5-heptanedionate.

14. The composition of claim 1 wherein the organometallic compound is zirconium acetylacetonate.

15. The composition of claim 1 wherein the organometallic compound is bis(pentamethylcyclopentadienyl) hafnium dichloride.

16. The composition of claim 1 which further comprises at least one member selected from the group consisting of silica, silicon, talcum, mica, metals, oxides thereof and compounds thereof.

17. The composition of claim 6 which further comprises at least one member selected from the group consisting of silica, silicon, talcum, mica, metals, oxides thereof and compounds thereof.

18. The composition of claim 1 being a homogeneous solution.

19. A resist composition exhibiting improved resistance to reactive ion etching which comprises a radiation sensitive polymer and at least one organometallic compound selected from the group consisting of 1,2-diferrocenylethane, aluminum tris(2,2,6,6-tetramethyl)-3,5-heptanedionate, aluminum lactate, aluminum-8-hydroxyquinoline, aluminum-8-hydroxyquinoline, bis(tert-butylcyclopentadienyl) titanium dichloride and bis(cyclopentadienyl) titanium pentasulfide.

20. The composition of claim 19 wherein the organometallic mpound is 1,2-diferrocenylethane.

21. The composition of claim 19 wherein the organometallic compound is aluminum tris(2,2,6,6-tetramethyl)-3,5-heptanedionate.

22. The composition of claim 19 wherein the organometallic compound is aluminum lactate.

23. The composition of claim 19 wherein the organometallic compound is aluminum-8-hydroxyquinoline.

24. The composition of claim 16 wherein the organometallic compound is bis(tert-butlcyclopentadienyl) titanium dichloride.

25. The composition of claim 16 wherein the organometallic compound is bis(cyclopentadienyl) titanium pentasulfide.

* * * * *